(12) United States Patent
Sonderman et al.

(10) Patent No.: US 6,645,780 B1
(45) Date of Patent: Nov. 11, 2003

(54) METHOD AND APPARATUS FOR COMBINING INTEGRATED AND OFFLINE METROLOGY FOR PROCESS CONTROL

(75) Inventors: Thomas J. Sonderman, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/022,321

(22) Filed: Dec. 13, 2001

(51) Int. Cl.[7] ............................................. H01L 21/66
(52) U.S. Cl. ...................................................... 438/14
(58) Field of Search .................... 438/14, 692; 700/121

(56) References Cited

U.S. PATENT DOCUMENTS 6,408,220 B1 * 6/2002 Nulman .................. 700/121

* cited by examiner

*Primary Examiner*—John F. Niebling
*Assistant Examiner*—Andre C Stevenson
(74) *Attorney, Agent, or Firm*—Williams, Morgan, & Amerson, P.C.

(57) ABSTRACT

A method and an apparatus for combining integrated and offline metrology data for process control. A process operation on a first semiconductor wafer within a first lot of semiconductor wafers is performed. Integrated metrology data from the first semiconductor wafer is acquired, the integrated metrology data comprising inline metrology data. A dynamic time process control based upon the integrated metrology data is performed, the dynamic time process control comprising a wafer-to-wafer feedback loop. A second semiconductor wafer within the first lot is processed based upon the dynamic time process. Offline metrology data from at least one of the first semiconductor wafer and the second semiconductor wafer from the lot is acquired. A constant time process control based upon the offline metrology data and the integrated metrology data is performed, the constant time comprising performing a lot-to-lot feedback process.

12 Claims, 10 Drawing Sheets

METHOD AND APPARATUS FOR COMBINING INTEGRATED AND OFFLINE METROLOGY FOR PROCESS CONTROL

BACKGROUND OF THE INVENTION

1. Field of the Invention

This invention relates generally to semiconductor manufacturing, and, more particularly, to a method and apparatus for determining a desirable mixture of integrated and off-line metrology data perform process control.

2. Description of the Invention

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (deposition, etching, ion implanting, or the like), to the packaging and final testing of the completed device, are so different from one another and specialized that the processes may be performed in different manufacturing areas or locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for variety of purposes, e.g., in a gate electrode structure for transistors. The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The wafer 105 typically includes a plurality of individual semiconductor die 155 arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the under-lying layer. The patterned layer of photoresist is comprised of a plurality of features, e.g., line-type features or opening-type features that are to be replicated in an underlying process layer.

Turning now to FIG. 2, one example of a block diagram representation of a typical manufacturing process flow is illustrated. A manufacturing system prompts a first processing tool to perform a first process upon a semiconductor wafer 105 (block 210). A manufacturing data acquisition tool (e.g., a metrology tool) then analyzes at least some of the processed semiconductor wafers 105 (block 220). The metrology data acquired is then analyzed in a data analysis tool, e.g., a computer. The analyzed data can then be used to adjust various parameters related to manufacturing control of subsequent processes in order to reduce any effects of existing manufacturing errors (block 240). Once the manufacturing data analysis is performed, manufacturing data for feedback corrections is made available to the manufacturing system (block 250). The manufacturing system then uses the feedback data to perform corrections on subsequent processes performed on other semiconductor wafers 105 by a processing tool.

Generally, feedback data that is used to correct process deviations to reduce the effects of errors is acquired in an offline manner. The manufacturing data is then analyzed to produce possible feedback correction data to subsequent processing performed on a subsequent lot of semiconductor wafers 105. Utilizing the feedback method illustrated in FIG. 2, a coarse adjustment to the processing scheme is possible, feedback adjustments from one lot to another. Therefore, several semiconductor wafers 105 within a first lot may contain errors or imperfections that may not be present in a subsequent lot of semiconductor wafers 105, resulting in an inconsistent level of quality of manufactured semiconductor wafers 105. Furthermore, utilizing the prior art feedback scheme, errors occurring on a first few semiconductor wafers 105 within a lot may continue to propagate to the remaining semiconductor wafers 105 within the same lot.

The present invention is directed to overcoming, or at least reducing the effects of, one or more of the problems set forth above.

SUMMARY OF THE INVENTION

In one embodiment of the present invention, a method is provided for combining integrated and offline metrology data for process control. A process operation on a first semiconductor wafer within a first lot of semiconductor wafers is performed. Integrated metrology data from the first semiconductor wafer is acquired, the integrated metrology data comprising inline metrology data. A dynamic time process control based upon the integrated metrology data is performed, the dynamic time process control comprising a wafer-to-wafer feedback loop. A second semiconductor wafer (which may be one of a plurality of subsequently processed semiconductor wafers) within the first lot is processed based upon the dynamic time process. Offline metrology data from at least one of the first semiconductor wafer and the second semiconductor wafer from the lot is acquired. A constant time process control based upon the offline metrology data and the integrated metrology data is performed, the constant time comprising performing a lot-to-lot feedback process.

In another embodiment of the present invention, a system is provided for combining integrated and offline metrology data for process control. The system of the present invention comprises a process controller to perform a dynamic time process control and a constant time process control, the process controller being capable of: performing a process operation on a first semiconductor wafer within a first lot of semiconductor wafers; acquiring integrated metrology data from the first semiconductor wafer, the integrated metrology data comprising inline metrology data; performing the dynamic time process control based upon the integrated metrology data, the dynamic time process control comprising a wafer-to-wafer feedback loop; processing a second semiconductor wafer within the first lot based upon the dynamic time process; acquiring offline metrology data from at least one of the first semiconductor wafer and the second semiconductor wafer from the lot; and performing the constant time process control based upon the offline metrology data and the integrated metrology data, the constant time comprising performing a lot-to-lot feedback process. The system of the present invention also comprises: a metrology data storage unit operatively coupled to the process controller, the metrology data storage unit to receive the integrated metrology data and the offline metrology data; and an inline/offline metrology data integrating unit operatively coupled to the process controller and the metrology data storage unit, the inline/offline metrology data unit to combine the integrated metrology data with the offline metrology data for utilization in performing the dynamic time process control and the constant time process control.

BRIEF DESCRIPTION OF THE DRAWINGS

The invention may be understood by reference to the following description taken in conjunction with the accompanying drawings, in which like reference numerals identify like elements, and in which.

Figure 1:
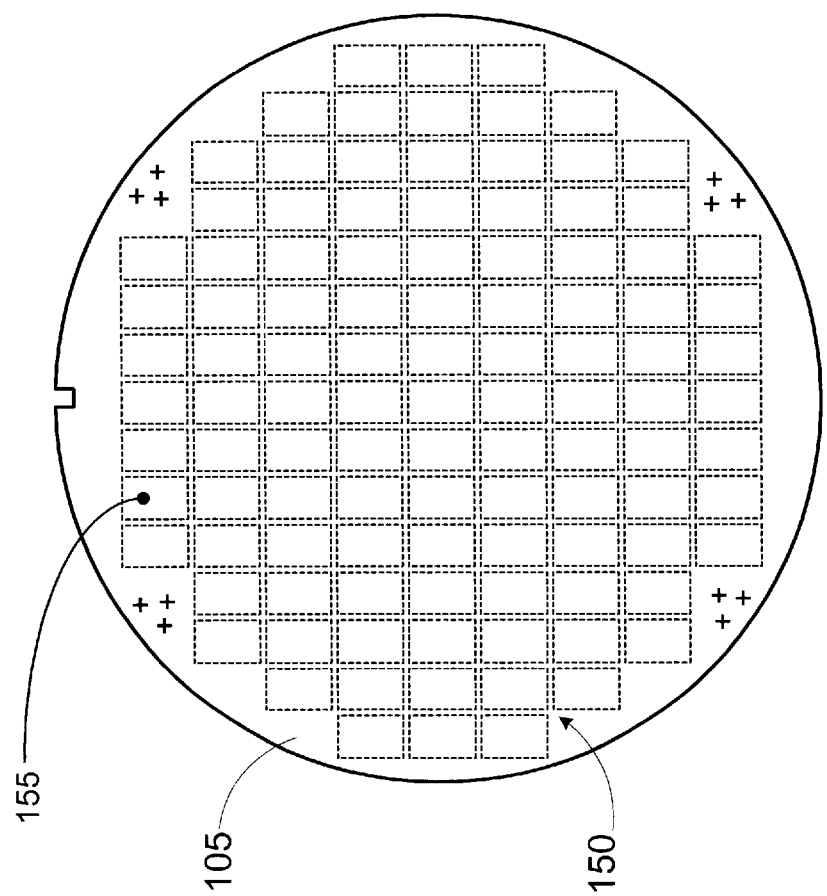
FIG. 1 is a simplified diagram of a prior art semiconductor wafer being processed.
Figure 2:
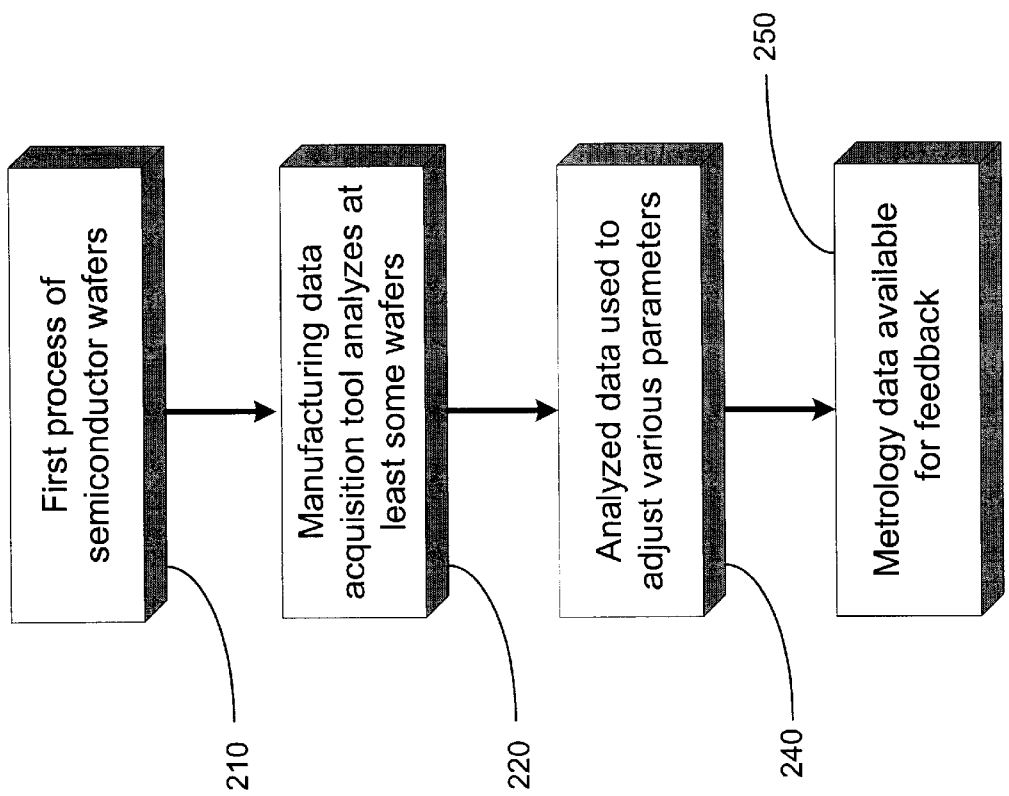
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, at least a portion of a manufacturing lot of semiconductor wafers is examined by offline metrology tools after a process operation is performed in the semiconductor wafers. Errors discovered during this examination can be used to generate modifications for subsequent processes performed on the semiconductor wafers. These modifications to the new process are generally used to reduce the effects of errors discovered in the original process. Many times, offline metrology data results become available too late for performing such downstream modifications in a timely manner. Offline metrology data allows for performing coarse feedback adjustments that are generally applicable to semiconductor wafers from a different lot.

In a general sense, embodiments of the present invention provide for acquiring integrated metrology data for performing coarse feedback adjustments as well as more fine-point feedback adjustments for process control. Embodiments of the present invention provide for acquiring integrated metrology data, which can be used to provide a dynamic time feedback control for processing semiconductor wafers within a particular lot. Embodiments of the present invention provide for integrating offline metrology data with integrated metrology data, thereby providing a coarse and a fine-point feedback adjustment for process control. Utilizing embodiments of the present invention, a feedback process control of semiconductor wafers within a particular lot and across a plurality of lots can be performed, providing more robust feedback control of manufacturing processes.

In one embodiment, offline metrology data includes metrology data that is not part of the production flow during processing of semiconductor wafers 105. For example, offline metrology data may refer to electrical test results of the processed semiconductor wafers 105, yield of the processed semiconductor wafers 105, and the like. Offline metrology data can be used to perform feedback adjustments to subsequent processes performed on semiconductor wafers 105 from a different lot, e.g., lot-to-lot feedback process control.

In one embodiment, inline metrology data includes metrology data acquired by a standalone metrology tool yielding data associated with a particular processing operation. For example, inline metrology data may include data relating to film thickness, line-width of certain features on processed semiconductor wafers 105, overlay measurements resulting from photolithography measurements, and the like. An integrated metrology tool, which is described in greater detail below, may be used to acquire integrated metrology data. In one embodiment, integrated metrology data includes inline metrology data that is acquired by a metrology tool integrated into a processing tool, which is described in greater detail below. Inline metrology data acquired by the integrated metrology tool may be used to perform feedback adjustments to processing of semiconductor wafers 105 within a particular lot, e.g., wafer-to-wafer feedback process control.

Figure 3:
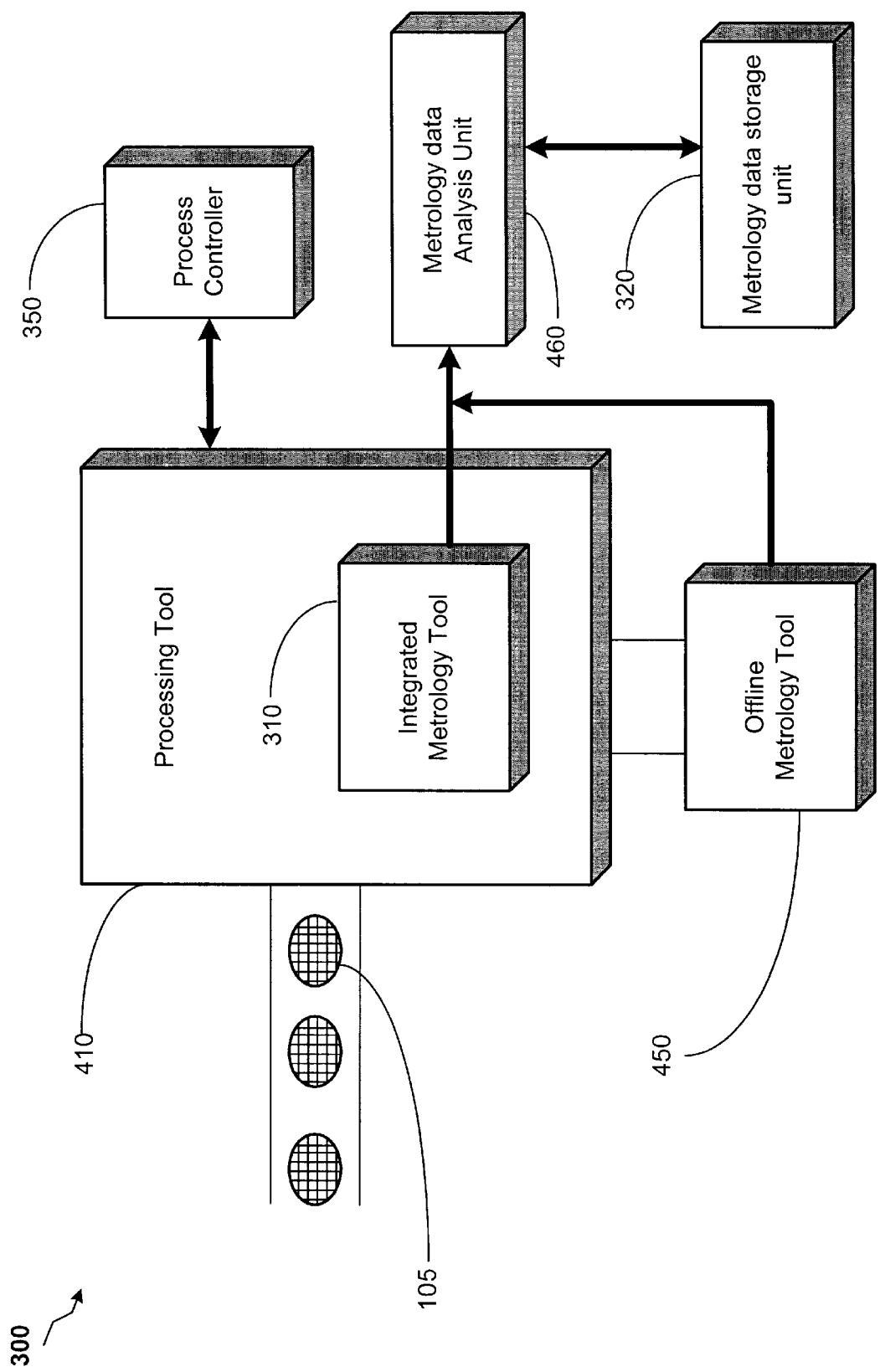
FIG. 3 is a block diagram representation of a system in accordance with one illustrative embodiment of the present invention.

Turning now to FIG. 3, a system 300 capable of performing the methods taught by at least one embodiment of the present invention is illustrated. In one embodiment, a processing tool 410 comprises an integrated metrology tool 310. In one embodiment, the integrated metrology tool 310 is capable of acquiring integrated metrology data (e.g., acquiring metrology data of semiconductor wafers 105 while they are still under the control of the processing tool 410), which includes inline metrology data. Acquiring inline metrology data is generally less intrusive to a manufacturing process flow, as compared to acquiring offline metrology data, which requires the use of an external metrology data tool. A set of semiconductor wafers 105 may be provided to the processing tool 410 by one of a plurality of wafer transporting apparatuses, e.g., a wafer-cassette (not shown).

The integrated metrology tool 310 acquires metrology data in an inline fashion. In other words, during, or immediately following a manufacturing process, the integrated metrology tool 310 acquires data from one or more of the processed semiconductor wafers 105. In one embodiment, the integrated metrology tool 310 is placed within a chamber (not shown) associated with the processing tool 410. In one embodiment, data from the integrated metrology tool 310 (real-time and/or near real-time data) may be sent to a metrology data analysis unit 460. The metrology data analysis unit 460 organizes, analyzes, and correlates metrology data acquired by the integrated metrology tool 310 to particular semiconductor wafers 105 that were examined. The metrology data analysis unit 460 forwards the integrated metrology data to the metrology data storage unit 320. The metrology data storage unit 320 stores the metrology data such that it can be retrieved by the system 300 for further analysis during or after a manufacturing process cycle. The real-time, or near real-time, metrology data stored in the metrology data storage unit 320 provides the system 300 access to immediate manufacturing data that can be used to further correct or enhance the accuracy of one or more processes performed on the semiconductor wafers 105 within a particular lot. In other words, the system illustrated in FIG. 3 is capable of performing wafer-to-wafer feedback process control.

The system 300 may also include an offline metrology tool 450 that may be used to acquire metrology data about one or more of the wafers 105 processed in the processing tool 410. Data acquired by the offline metrology tool 450 may also be sent to a metrology data analysis unit 460. The metrology data analysis unit 460 organizes and correlates offline metrology data with particular semiconductor wafers 105 and/or particular lots. The metrology data analysis unit 460 can be a software unit, a hardware unit, or a firmware unit. In various embodiments, the metrology data analysis unit 460 is integrated into the computer system 430 (shown in FIG. 4) or may be integrated into the offline metrology tool 450.

In one embodiment, the system 300 acquires and stores (into the metrology data storage unit 320) integrated metrology data from a processed semiconductor wafer 105 within a given lot while performing process operations on semiconductor wafer 105 within the same lot. The integrated metrology data stored in the metrology data storage unit 320 includes sets of data that may represent a variety of aspects of a processed semiconductor wafer 105, e.g., the data may represent the line width of features formed on the semiconductor wafer 105, the trench depth of an STI trench, the side-wall angle (with respect to the vertical plane) of trench structures formed on the semiconductor wafer 105, and the like. In one embodiment, data in the metrology data storage unit 320 can be used for feedback correction in order to improve the efficiency and accuracy of processing of semiconductor wafers 105 in the processing tool 410 on a wafer-to-wafer basis. Likewise, the offline metrology data acquired by the offline metrology tool 450 may be used to perform lot-to-lot (or run-to-run) feedback process control, in addition to the wafer-to-wafer feedback process control described above. The system 300 also comprises a process controller 350, which is capable of controlling the functions and operations of the components of the system 300 described above. The process controller 350 may be a software, hardware, firmware, or a combination thereof.

Figure 4:
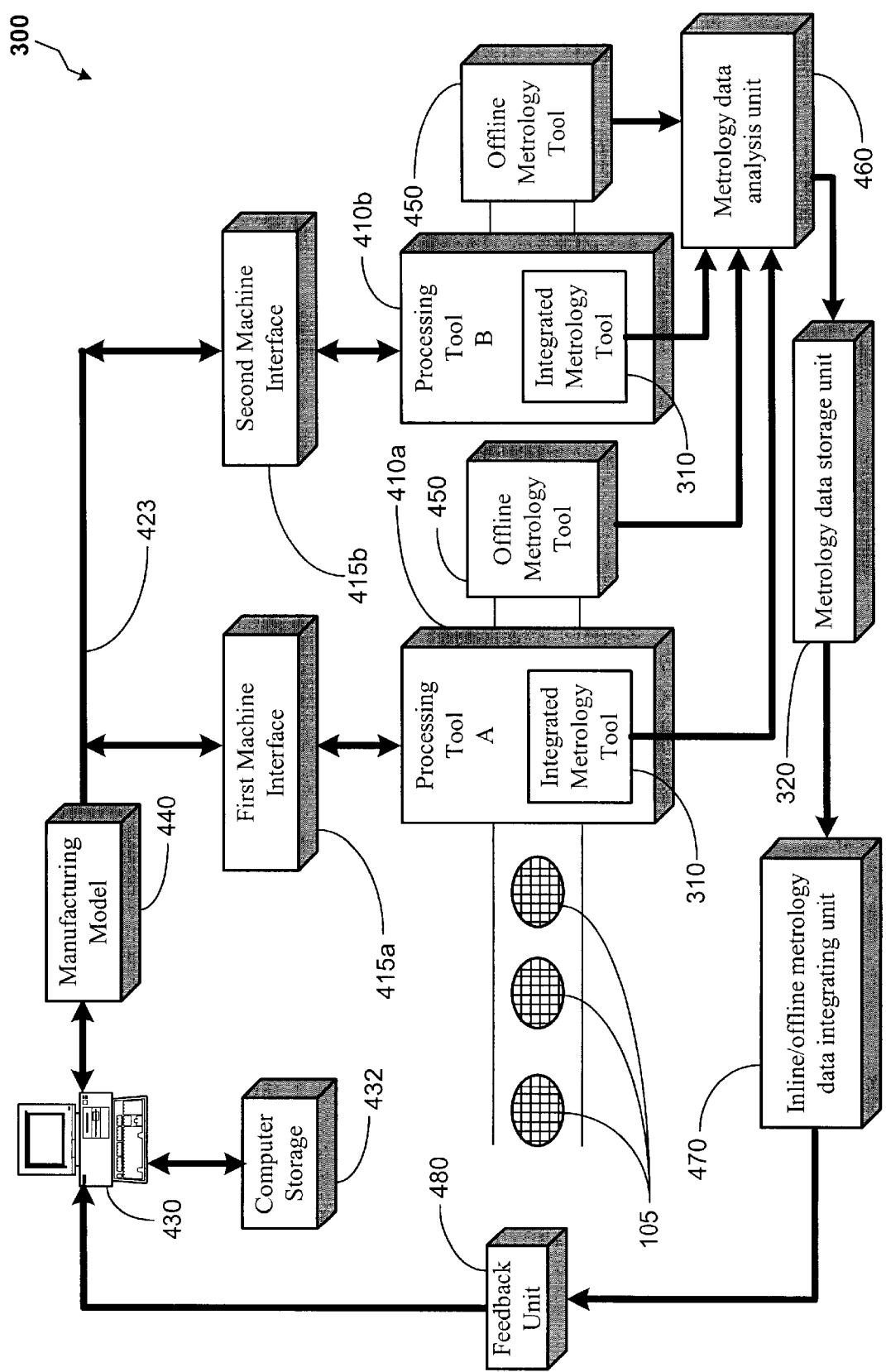
FIG. 4 illustrates a more detailed block diagram representation of the system shown in FIG. 3 in accordance with one illustrative embodiment of the present invention.

Turning now to FIG. 4, a more detailed block diagram of the system 300 in accordance with one embodiment of the present invention is illustrated. In one embodiment, semiconductor wafers 105 are processed on processing tools 410a, 410b using a plurality of control input signals, or manufacturing parameters, provided via a line or network 423. In one embodiment, control input signals, or manufacturing parameters, on the line 423 are sent to the processing tools 410a, 410b from a computer system 430 via machine interfaces 415a, 415b. In one embodiment, the first and second machine interfaces 415a, 415b are located outside the processing tools 410a, 410b. In an alternative embodiment, the first and second machine interfaces 415a, 415b are located within the processing tools 410a, 410b. The semiconductor wafers 105 may be provided to and carried from a plurality of processing tools 410 by a variety of techniques. For example, semiconductor wafers 105 may be provided to a processing tool 410 manually, or may be provided to a processing tool 410 in an automatic fashion (e.g., robotic movement of semiconductor wafers 105). Additionally, the semiconductor wafers 105 may be transported in lots (e.g., stacked in cassettes) to the processing tools 410.

In one embodiment, the computer system 430 sends control input signals, or manufacturing parameters, on the line 423 to the first and second machine interfaces 415a, 415b. The computer system 430 is capable of controlling processing operations. In one embodiment, the computer system 430 is a process controller. The computer system 430 is coupled to a computer storage unit 432 that may contain a plurality of software programs and data sets. In one embodiment, the metrology data storage unit 320 may be integrated into the computer storage unit 432. The computer system 430 may contain one or more processors not shown) that are capable of performing the operations described herein. The computer system 430 employs a manufacturing model 440 to generate control input signals on the line 423. In one embodiment, the manufacturing model 440 contains a manufacturing recipe that determines a plurality of control input parameters that are sent on the line 423 to the processing tools 410*a*, 410*b*.

In one embodiment, the manufacturing model 440 defines a process script and input control that implement a particular manufacturing process. The control input signals (or control input parameters) on the line 423 that are intended for processing tool A 410*a* are received and processed by the first machine interface 415*a*. The control input signals on the line 423 that are intended for processing tool B 410*b* are received and processed by the second machine interface 415*b*. Examples of the processing tools 410*a*, 410*b* used in semiconductor manufacturing processes are steppers, etch process tools, deposition tools, and the like.

One or more of the semiconductor wafers 105 that are processed by the processing tools 410*a*, 410*b* can also be sent to an offline metrology tool 450 for acquisition of metrology data. The offline metrology tool 450 can be an optical data acquisition tool, an overlay-error measurement tool, a critical dimension measurement tool, and the like. In one embodiment, one or more processed semiconductor wafers 105 are examined by an offline metrology tool 450. Furthermore, metrology data may also be collected by the integrated metrology tool 310 within the processing tools 410*a* and 410*b*. As described above, data from the integrated metrology tool 310 and the offline metrology tool 450 may be collected by the metrology data analysis unit 460. The metrology data may be directed to a variety of physical or electrical characteristics of the devices formed on the wafers 105. For example metrology data may be obtained as to line width measurements, depth of trenches, sidewall angles, thickness, resistance, and the like. As described above, the metrology data analysis unit 460 organizes, analyzes, and correlates metrology data acquired by the offline metrology tool 450 to particular semiconductor wafers 105 that were examined.

In one embodiment, the metrology data analysis unit 460 sends metrology data (including inline-type and/or offline metrology data), from the integrated metrology tool 310 and offline metrology tool 450, respectively, to the metrology data storage unit 320 for storage. The system 300 is able to retrieve inline metrology data and offline metrology data and perform feedback analysis on a lot-to-lot and a wafer-to-wafer basis. Based upon specific requests for data, the integrated metrology data and the offline metrology data are sent to the inline/offline metrology data integrating unit 470. The inline/offline metrology data integrating unit 470 is capable of integrating offline and inline (from the integrated metrology tool 310) such that the system 300 is capable of utilizing the resulting data to perform lot-to-lot feedback process control (coarse feedback control) and wafer-to-wafer feedback process control (fine-point feedback control). In one embodiment, the inline/offline metrology data integrating unit 470 may be a software, hardware, or a firmware component of a computer system that can be a standalone unit or that can be integrated into the computer system 430.

In one embodiment, a feedback unit 480 is capable of calculating adjustment data that can be used to modify the control input parameters provided to one or more processing tools 410 that may subsequently perform various processes on other semiconductor wafers 105. The modification of the control input parameters are designed to reduce the errors discovered on the processed semiconductor wafers 105. The feedback unit 480 produces feedback data that is analyzed by the computer system 430, which then uses the manufacturing model 440 to modify control input parameters that control the operation of the processing tools 410. In one embodiment, the feedback unit 480 may be a software, hardware, or a firmware component of a computer system that can be a standalone unit or that can be integrated into the computer system 430.

Figure 5:
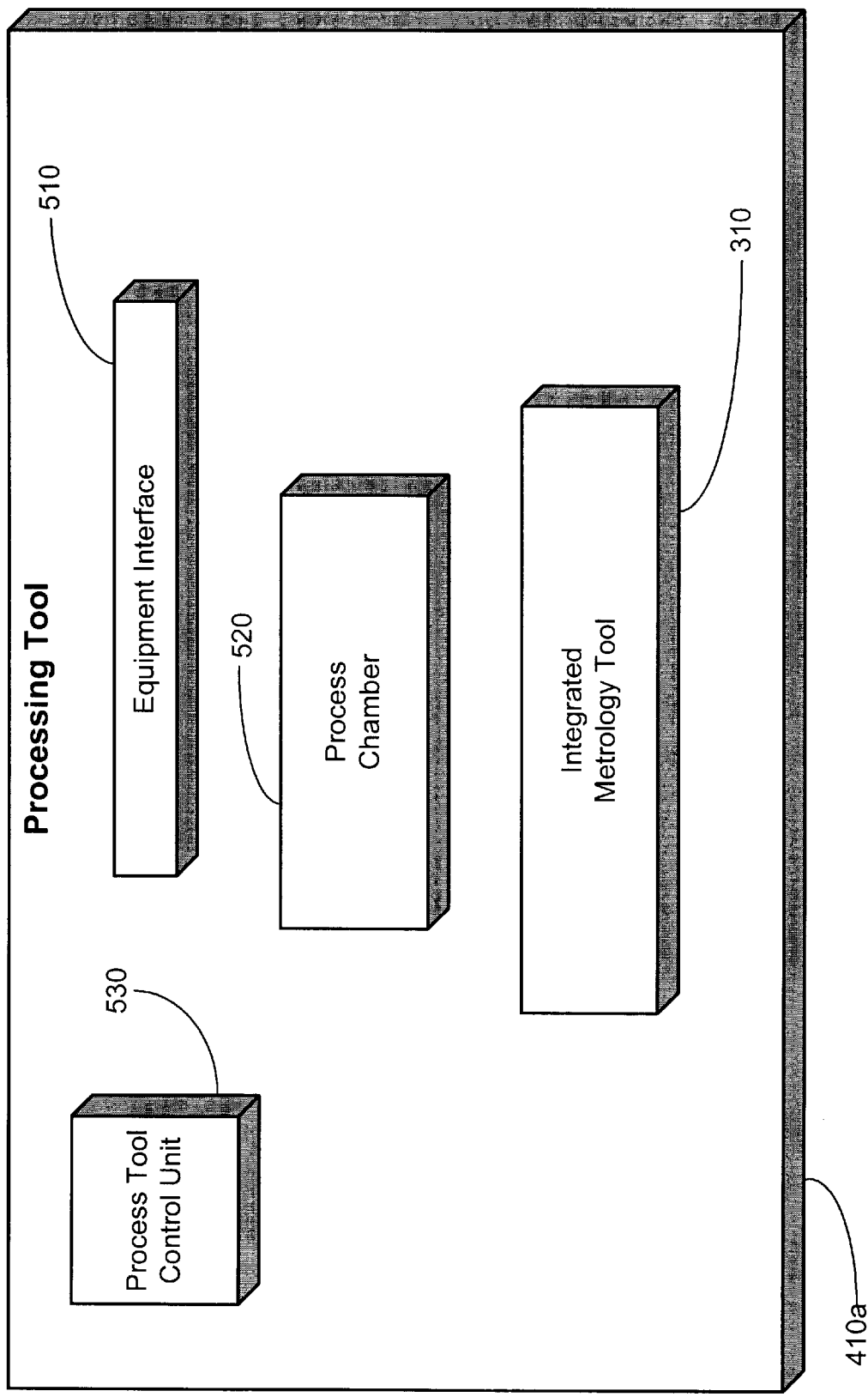
FIG. 5 illustrates a more detailed block diagram representation of a processing tool shown in FIGS. 3 and 4, in accordance with one illustrative embodiment of the present invention.

Turning now to FIG. 5, a more detailed block diagram illustration of an illustrative processing tool, such as processing tool 410*a* is shown. In one embodiment, the processing tool 410*a* comprises an equipment interface 510, a process chamber 520, a processing tool control unit 530, and an integrated metrology tool 310. The processing tool 410*a* receives control parameter data via the equipment interface 510. Data from the processing tool 410*a* is also sent to other portions of the system 300, such as the computer system 430, via the equipment interface 510. The processing tool control unit 530 controls processing operations of semiconductor wafers 105 in the process chamber 520. The process tool control unit 530 receives control parameter data, and/or instructions from the computer system 430, via the equipment interface 510, and executes the appropriate action.

The integrated metrology tool 310 acquires metrology data of the semiconductor wafers 105 that were processed in the chamber 520. The processing tool control unit 530 also controls the integrated metrology tool 310. In accordance with certain embodiments of the present invention, the integrated metrology tool 310 acquires real-time or near real-time metrology data from semiconductor wafers 105 processed, and makes such data available to the system 300 for more efficient and quick analysis of metrology data.

Figure 6:
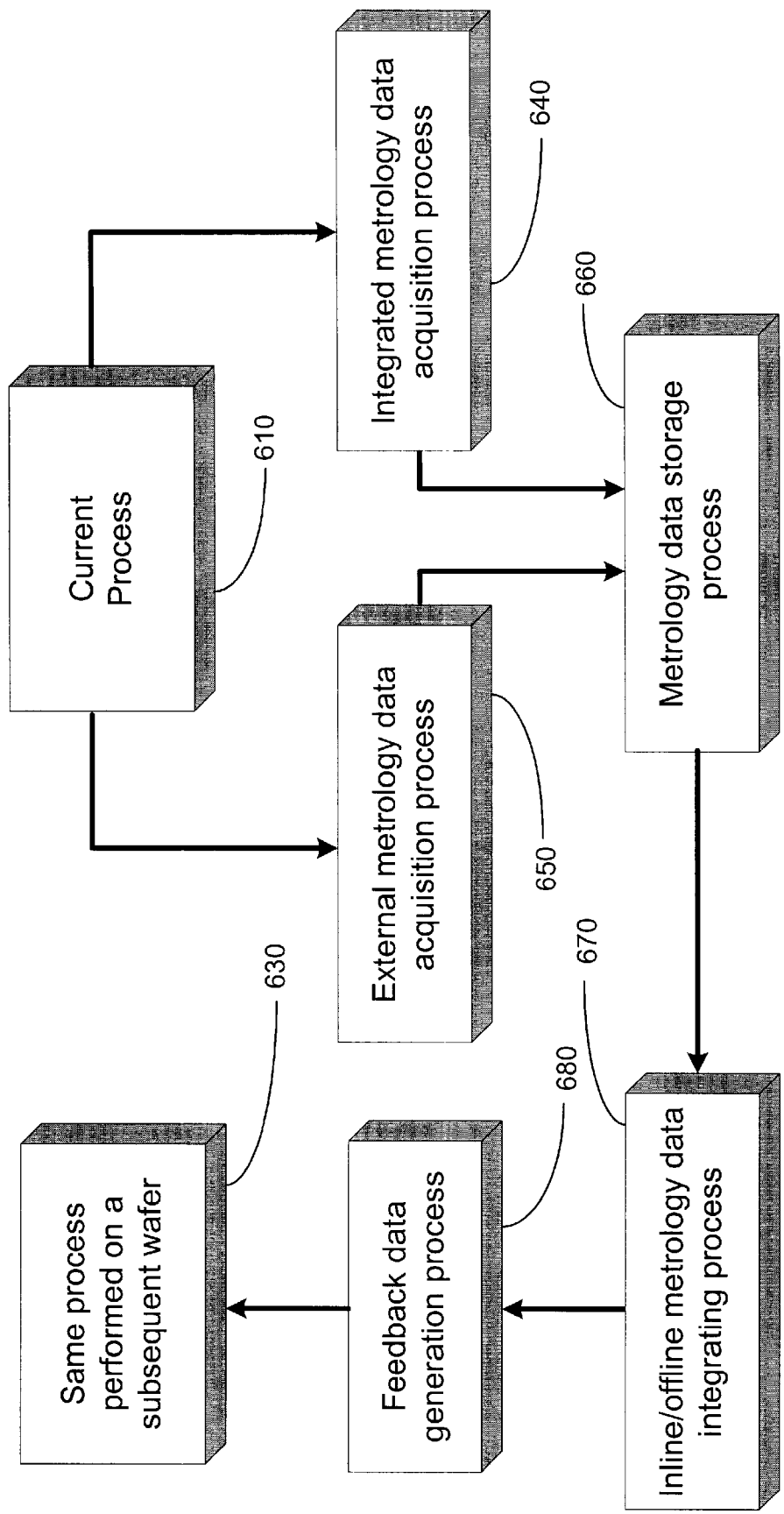
FIG. 6 illustrates a block diagram representation of a process flow in accordance with one illustrative embodiment of the present invention.

Turning now to FIG. 6, a block diagram representation of the manufacturing flow in accordance with one embodiment of the present invention is illustrated. A current process 610 is performed on a semiconductor wafer 105. The current process can be any of a variety of processes performed during the course of manufacturing integrated circuit devices, e.g., a photolithography process, a deposition process, an ion-implant process, an etch process, a chemical-mechanical polishing (CMP) process and the like. Either after or during the performance of the current process, the system 300 performs an integrated metrology data acquisition process (block 640) in order to acquire real-time or near real-time metrology data, (e.g., inline metrology data) for one or more of the wafers 105 process in the processing tool 410.

Once the current process 610 is performed on a predetermined number of semiconductor wafers 105, an external metrology data (offline) acquisition process may be also performed (block 650) on one or more of the wafers 105. The external metrology data acquisition process comprises extracting processed semiconductor wafers 105 from the manufacturing flow, and acquiring offline metrology data. In both cases, the offline metrology data and the integrated metrology data (including inline metrology data) are stored in the metrology storage facility for retrieval by the system 300 (block 660). In one embodiment, data from the metrology data storage process may be sent to the inline/offline metrology data integrating process (block 670), which performs the metrology data integration process described above.

In one embodiment, after combining the offline and integrated metrology data, a feedback data generation process is performed (block 680). In one embodiment, the feedback data generation process may be performed solely on data from the integrated metrology tool 310, since offline metrology data may only be available at a later time. Generally, the feedback process may be used to determine control input parameters to perform the same process step on subsequent semiconductor wafers 105. For example, if an excessive amount of material is deposited during the current process (block 610), feedback corrections may be made to the deposition process step(s) performed on subsequent semiconductor wafers 105 to reduce the likelihood of depositing excessive deposition of processing material. The compensation made to the process may involve adjusting one or more process variables of the process. For example, the compensation may include decreasing the time period of the deposition during the deposition process performed on a subsequent semiconductor wafer 105.

Figure 7:
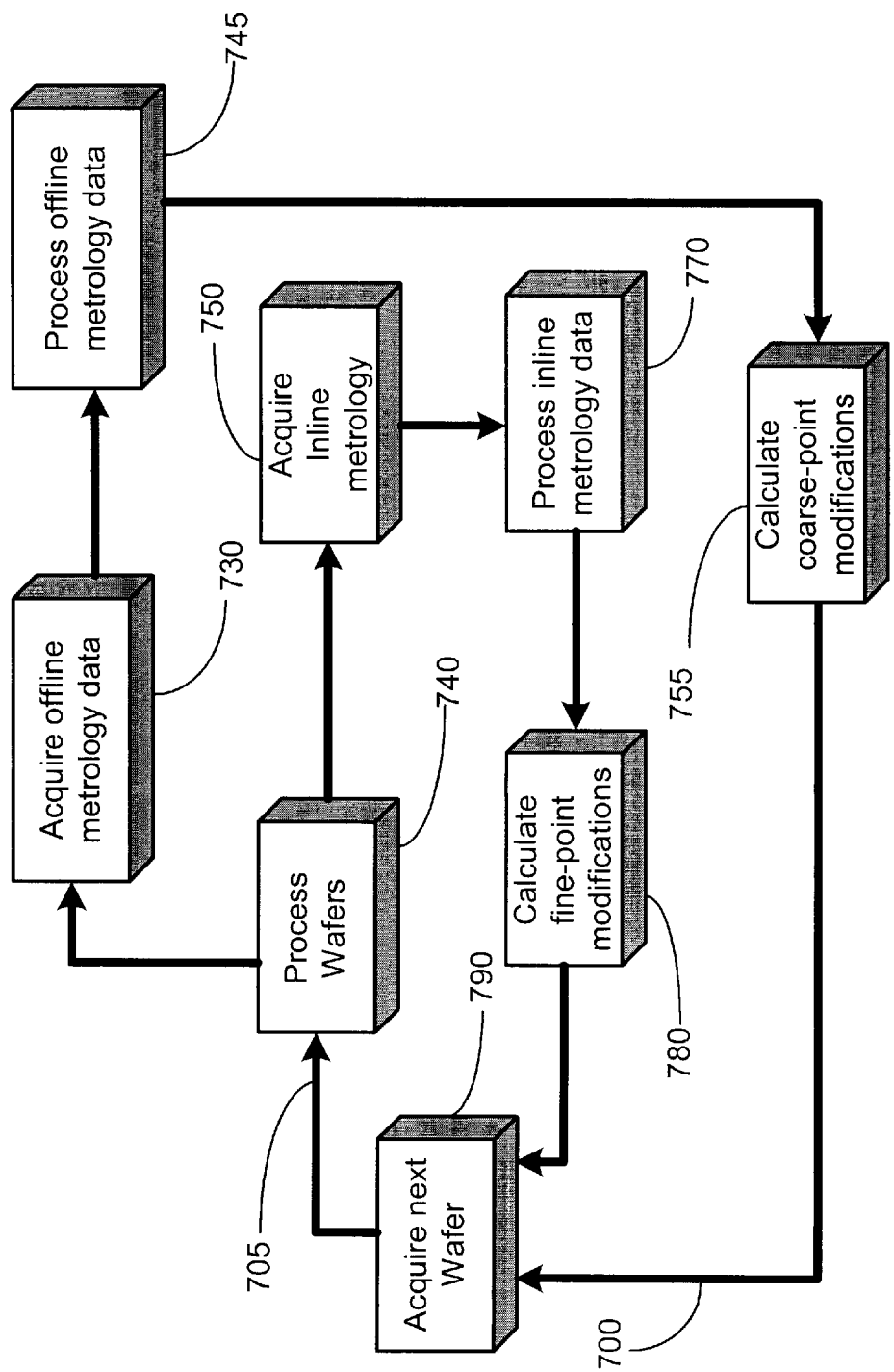
FIG. 7 illustrates a block diagram representation of a multi-tier feedback loop associated with the process flow of FIG. 6, in accordance with one illustrative embodiment of the present invention.

In one embodiment, the system 300, using the methods taught by embodiments of the present invention, can perform multiple feedback loops to improve the efficiency and accuracy of the manufacturing of semiconductor wafers 105. Turning now to FIG. 7, two illustrative feedback loops that may be used during semiconductor wafer manufacturing, are illustrated. The feedback loops utilized by the system 300 includes a run-to-run feedback loop 700 and a wafer-to-wafer feedback loop 705. Both feedback loops (700 and 705) can be used in concert during a manufacturing process for adjustment of control input parameters. In other words, both feedback loops (700 and 705) can be used to perform a cascading controlling function during processing of semiconductor wafers 105.

The inner loop, which is the wafer-to-wafer feedback loop 705, comprises processing semiconductor wafers 105 (block 740) and acquiring integrated metrology data from the one or more of the processed semiconductor wafers 105 (block 750). In one embodiment, the metrology data for the inner loop 705 is acquired by the integrated metrology tool 310. The system 300 then analyzes the integrated metrology data, which includes calculating the amount of error(s) and/or deviations from a predetermined specification existing on one or more of the processed semiconductor wafers 105 (block 770). Based upon the analyses, one or more correction factors may be calculated. The correction factors may then be used to modify one or more control input parameters that control the processing function performed on subsequent wafers 105 within the lot. The system 300 then calculates fine-point modifications to control input parameters that control the processing tools 410, based upon the errors (block 780). The system 300 then acquires the next semiconductor wafer 105 to be processed, and the wafer 105 is processed using the modified control input parameters (block 790-block 740), thereby forming a wafer-to-wafer feedback loop 705.

Using the wafer-to-wafer feedback loop 705, errors acquired from the processing of one or more semiconductor wafer 105 can be acquired quickly using the integrated metrology tool 310. The metrology data is then processed and used as feedback data for the processing of the next semiconductor wafer 105. The wafer-to-wafer feedback loop 705 illustrated in FIG. 7 provides for more accurate correction of errors within a particular lot of semiconductor wafers 105.

The lot-to-lot, or run-to-run, feedback loop 700 is created approximately simultaneously with the wafer-to-wafer feedback loop 705 by collecting the calculated errors and modifications and using them to correct errors during the next lot of semiconductor wafers 105. The system 300 analyzes offline metrology data, and in one embodiment, the inline metrology data, to calculate error(s) and/or deviations from predetermined specifications for a manufacturing lot as a whole. Based upon these analyses, one or more correction factors may be calculated. The correction factors then may be used to modify one or more control input parameters that control the processing function performed on an entire lot of semiconductor wafers 105. The system 300 then receives a new lot of semiconductor wafers 105 (block 790) and uses data and calculations acquired from the wafer-to-wafer feedback loop 705 to define an initial state of the control input parameters used for processing the next lot of semiconductor wafers 105. The system 300 also uses offline metrology data and/or inline metrology data acquired by the integrated metrology tool 310 for use in the run-to-run feedback loop. The system 300 processes the offline metrology data (block 745) and determines coarse-point modifications for lot-to-lot feedback adjustments (block 755). The system 300 then acquires semiconductor wafers 105 from the new lot of semiconductor wafers 105 and sends them to be processed (block 730 through block 740). The wafer-to-wafer feedback loop 705 is then repeated and the resulting calculations are used for a subsequent lot of semiconductor wafers 105. Therefore, two feedback loops, the run-to-run feedback loop 700 and the wafer-to-wafer feedback loop 705 are used separately, and sometimes simultaneously, to generate more efficiently and accurately processed semiconductor wafers 105.

In one embodiment, the inner (i.e., wafer-to-wafer feedback) loop 705 represents a dynamic time process loop, which is capable of dynamically providing feedback adjustments from one wafer to another within a lot or a manufacturing run of semiconductor wafers 105. Dynamic time process provides for reacting to process errors or deviations from predetermined tolerances on a non-constant, reactionary basis, where a process error or deviation occurring at any time can provoke a feedback adjustment. The outer (i.e., run-to-run feedback) loop 700 represents a constant time process loop, which is capable of providing feedback adjustments for manipulating control input parameters of process operations on a lot-to-lot, or run-to-run, basis. The constant time process provides for a predictable feedback adjustment process based upon a cumulative assessment of process errors or deviations from predetermined tolerances from a lot or manufacturing run of semiconductor wafers 105. Feedback adjustments provoked by the constant time process generally occur at predetermined intervals, such as lot-to-lot feedback adjustments. Using the dynamic time process and the constant time processes, two types of feedback loops can be implemented into a single process control.

Figure 8:
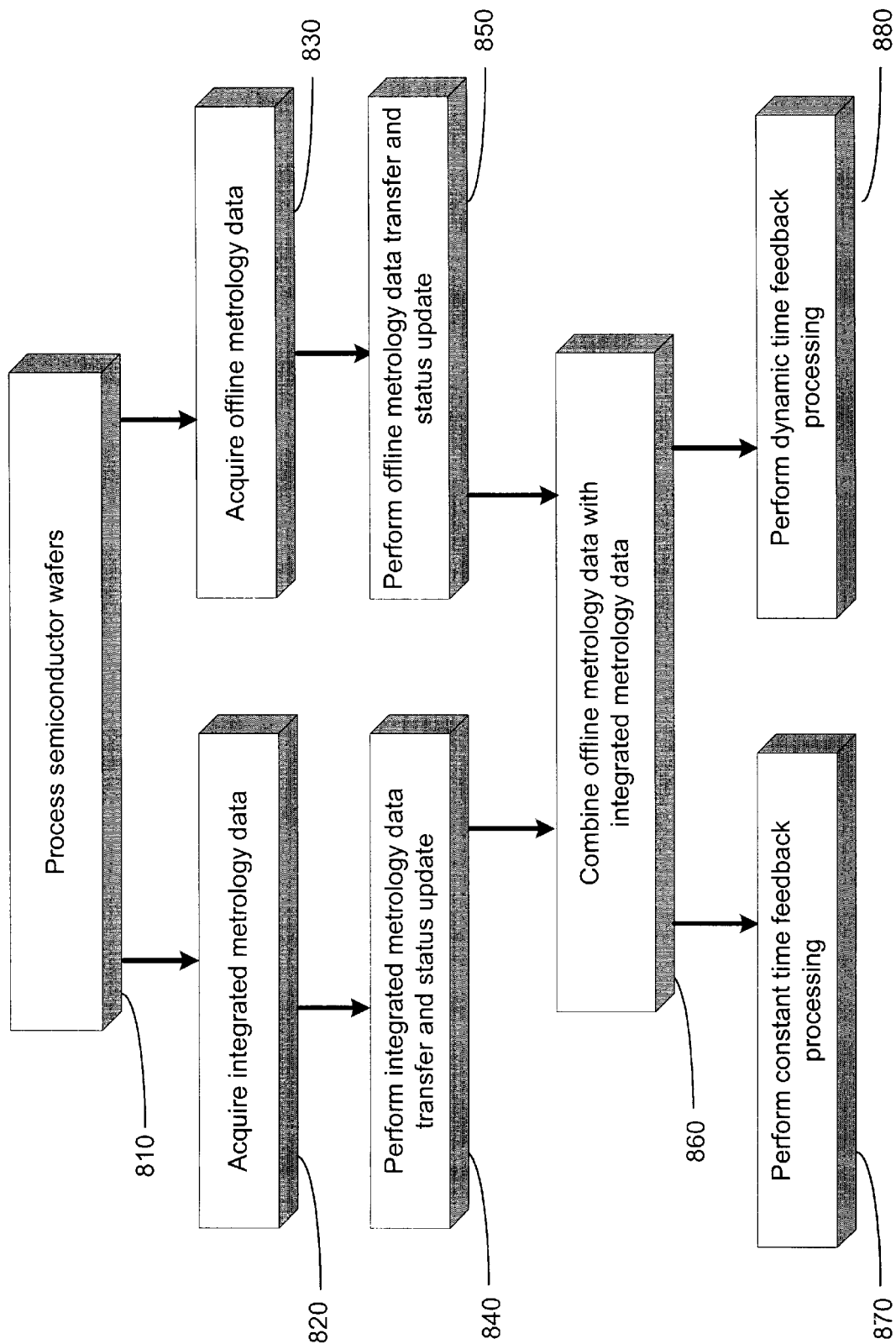
FIG. 8 illustrates a flowchart depiction of a method in accordance with one illustrative embodiment of the present invention.

Turning now to FIG. 8, a flowchart representation of a method in accordance with one embodiment of the present invention is illustrated. A manufacturing lot of semiconductor wafers 105 is processed by the system 300 (block 810). The process performed on the semiconductor wafers 105 may be any of a variety of processing operations commonly performed in modem integrated circuit manufacturing facilities, e.g., a photolithography process, a deposition process, an ion implant process, an etch process, a CMP process, and the like. Integrated metrology data may be acquired from one or more of the processed semiconductor wafers 105 by the system 300 (block 820). In one embodiment, the integrated metrology tool 310 acquires integrated metrology data. In an alternative embodiment, offline metrology data is acquired from one or more of the processed semiconductor wafers 105 (block 830). In one embodiment, the offline metrology data may be acquired by offline metrology tool 450, which may occur after substantially all of the wafers 105 in the lot have been processed. More detailed illustrations of the steps for acquiring integrated metrology data and offline metrology data are provided in FIGS. 9A and 9B, and by their accompanying description provided below.

Once the integrated metrology data is acquired by the system 300, the system 300 performs an integrated metrology data and status update (block 840). In other words, the newly acquired integrated metrology data (e.g., inline data acquired by the integrated metrology tool 310) is added to the metrology data storage unit 320. The processing tool 410 updates the system 300 regarding the availability of the newly acquired integrated metrology tool 310. Accordingly, the system 300 can recognize when real-time or near real-time data is available. Similarly, the system 300 transfers offline metrology data and alerts the system 300 that offline metrology data is available for analysis (block 850). More detailed descriptions of performing the integrated metrology and the offline metrology data transfer and status update are provided in FIGS. 10A and 10B, and by their accompanying description below.

In one embodiment, the system 300 combines inline metrology data (from the integrated metrology tool 310) with offline metrology data, as described above (block 860). Combining inline and offline metrology data comprises associating errors and/or manufacturing tolerance deviations with particular processes performed on particular semiconductor wafers 105. Therefore, modifications to control input parameters used to control manufacturing processes may be calculated by analyzing the combined inline and offline metrology data. In one embodiment, process modifications dictated by analysis of integrated metrology data may take priority over process modifications dictated by analysis of offline metrology data. In an alternative embodiment, process modifications dictated by analysis of offline metrology data may take priority over process modifications dictated by analysis of integrated metrology data.

The system 300 then performs a constant time feedback process on a lot-to-lot basis (block 870) and a dynamic time feedback process on a wafer-to-wafer level (block 880). The constant time feedback process and the dynamic time feedback processes performed by the system 300 are described above. The constant time and the dynamic time feedback processes provide coarse and fine-point feedback adjustments for improving the processing of subsequent semiconductor wafers 105.

Figures 9A, 9B:
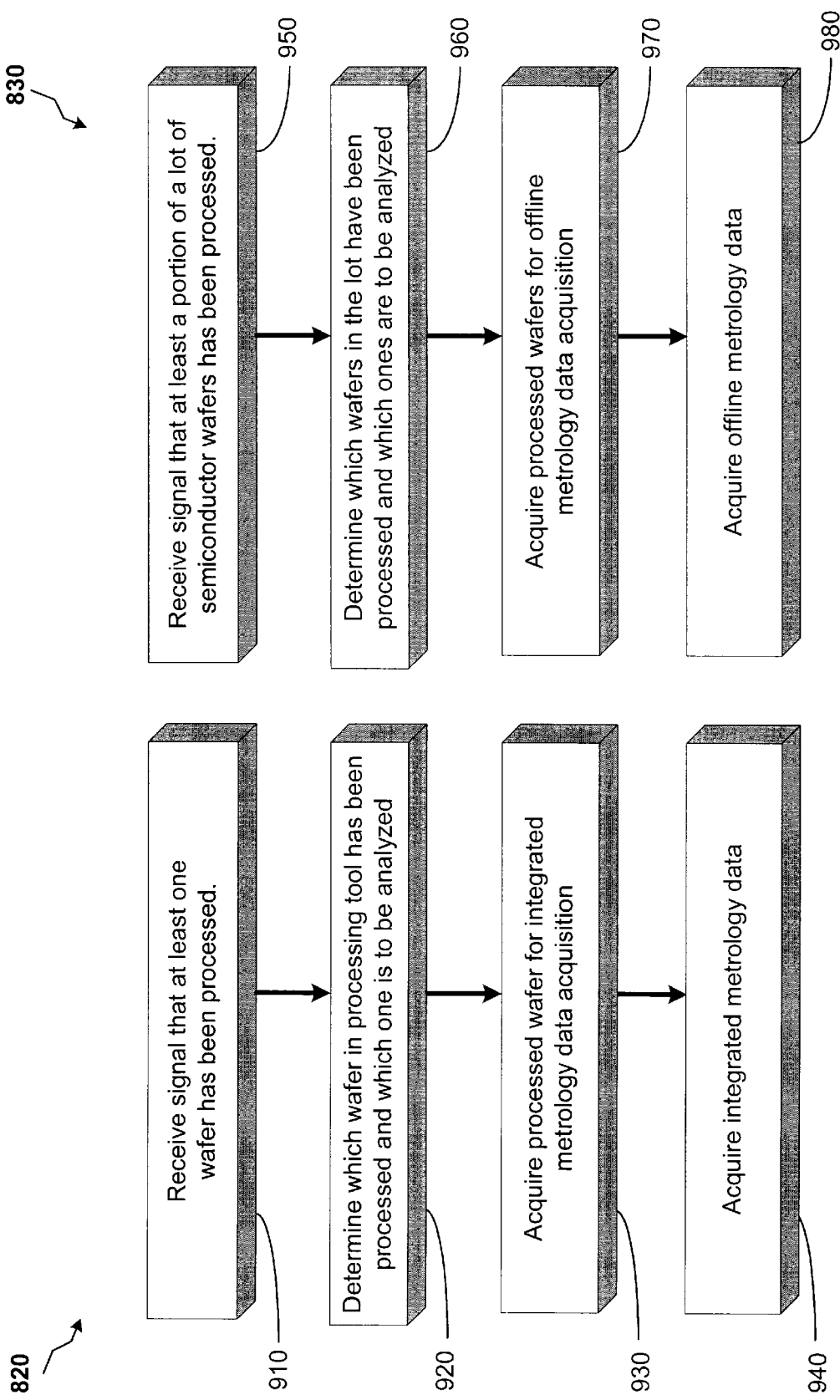
FIG. 9A illustrates a flowchart depiction of a method of acquiring integrated metrology data, as indicated in FIG. 8, in accordance with one illustrative embodiment of the present invention.
FIG. 9B illustrates a flowchart depiction of a method of acquiring offline metrology data, as indicated in FIG. 8, in accordance with one illustrative embodiment of the present invention.

Turning now to FIGS. 9A and 9B, flowchart depictions of illustrative embodiments of methods for acquiring integrated and offline metrology data. After the system 300 processes a semiconductor wafer 105, a signal is received by the system 300 indicating that at least one semiconductor wafer 105 has been processed (block 910). Similarly, after wafers representing a portion of a manufacturing lot are processed, the system 300 receives a signal indicating as such (block 950). In one embodiment, the equipment interface 510 sends the signals described in blocks 910 and 950 to the computer system 430, indicating the status of a process completion.

When the system 300 learns that a semiconductor wafer 105 has been processed, it makes a determination as to which semiconductor wafer 105 in the processing tool 410 has been processed and is next in queue for inline metrology analysis (block 920). Similarly, the system 300 makes a determination as to which set of semiconductor wafers 105 within a lot have been processed and are next in queue for offline metrology analysis (block 960). Generally, the order of metrology analysis performed on the semiconductor wafers 105 follows the order of processing within the processing tool 410.

Once the system 300 determines and targets a particular semiconductor wafer 105 for inline metrology analysis, the system 300 acquires that particular wafer 105 for integrated metrology data acquisition (block 930). Similarly, the system 300 targets a plurality of semiconductor wafers 105 representing at least a portion of a lot for offline metrology data acquisition (block 970). The system 300 then acquires inline metrology data and/or offline metrology data from the targeted semiconductor wafers 105 (blocks 940 and 980) using the integrated metrology tool 310 and the offline metrology tool 450, respectively. The completion of the steps illustrated in FIGS. 9A and 9B substantially completes the process of acquiring integrated metrology data and offline metrology data, as indicated in blocks 820 and 830 of FIG. 8.

Figure 10B:
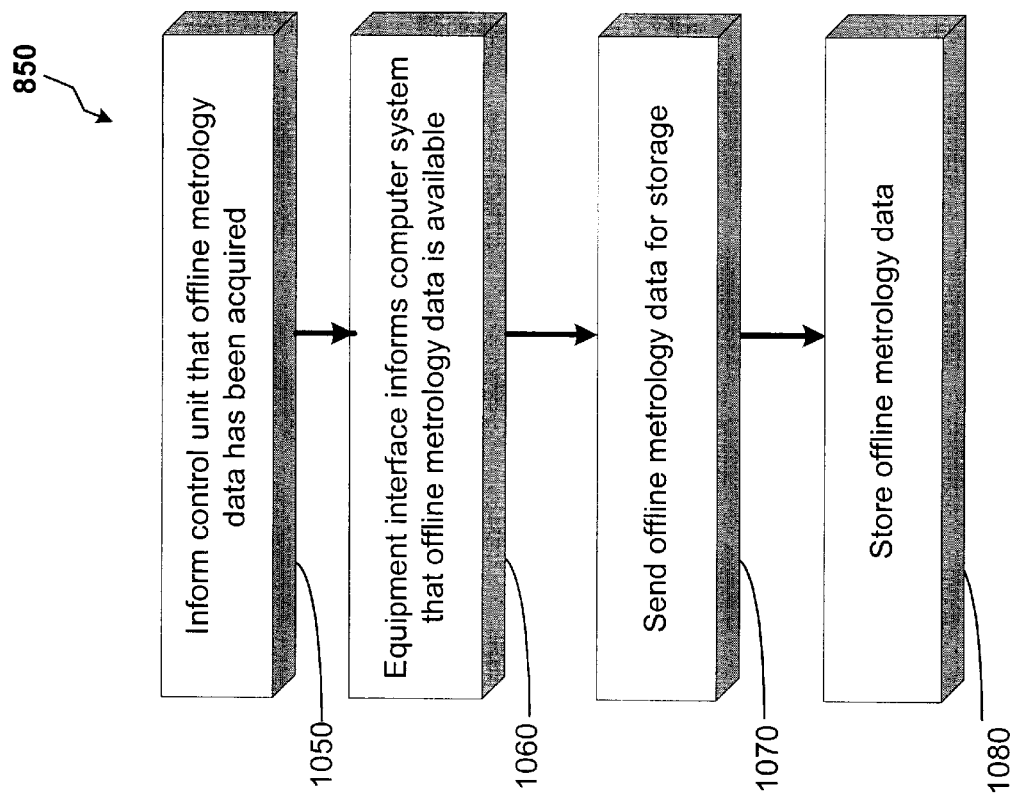
FIG. 10B illustrates a flowchart depiction of a method of performing offline metrology data transfer and status update, as indicated in FIG. 7, in accordance with illustrative one embodiment of the present invention.
Figure 10A:
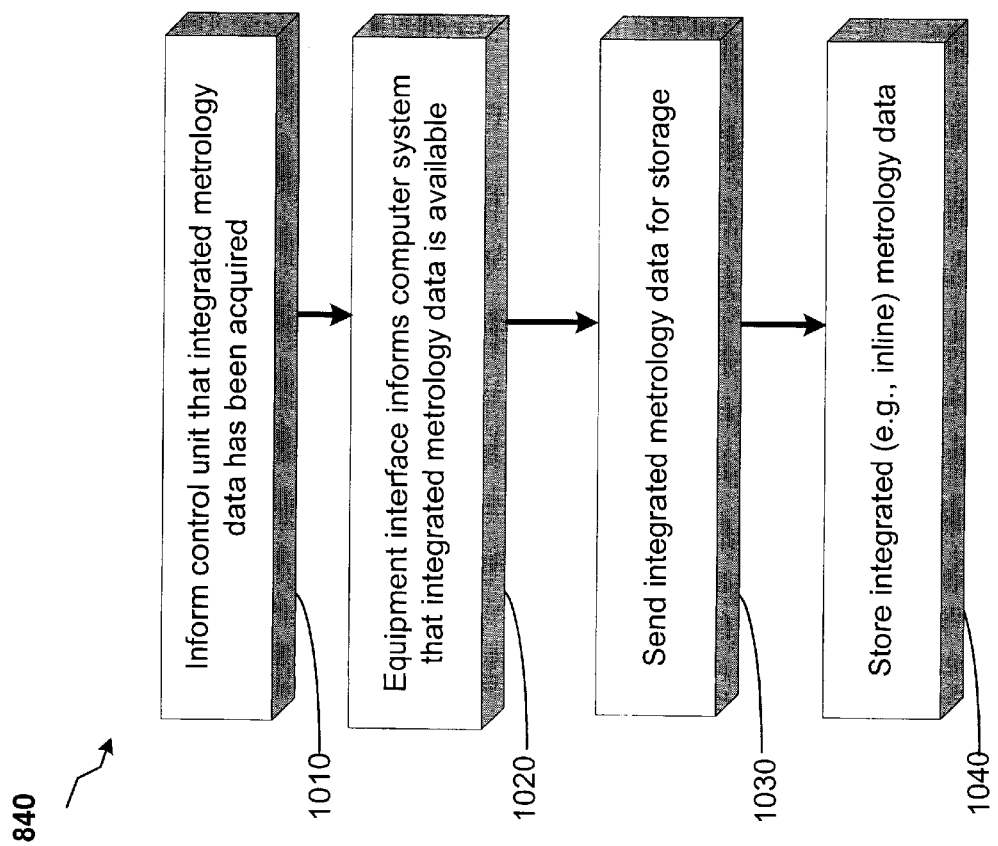
FIG. 10A illustrates a flowchart depiction of a method of performing integrated metrology data transfer and status update, as indicated in FIG. 7, in accordance with illustrative one embodiment of the present invention.

FIGS. 10A and 10B are flowchart representations of the methods for performing an integrated metrology data and offline metrology data transfer and status update, as described respectively in blocks 840 and 850 of FIG. 8. As shown herein, once the system 300 acquires integrated metrology data and/or offline metrology data, the process tool control unit 530 is informed that integrated or offline metrology data has been acquired (blocks 1010 and 1050). The process tool control unit 530 then communicates with the equipment interface 510, which informs the computer system 430 that integrated metrology data and/or offline metrology data is available (blocks 1020, 1060), so that the computer system 430 can execute an efficient reaction to the integrated and/or offline metrology data.

In one embodiment, communications between the processing tool 410 and the computer system 430 is performed via the machine interface 415. The system 300 then directs the integrated metrology and/or offline metrology from the processing tool 410 data to the computer system 430 for storage (blocks 1030, 1070). In one embodiment, the integrated metrology and the offline metrology data is sent via the equipment interface 510 and the machine interface 415, onto the computer system 430. In one embodiment, the computer system 430 stores the integrated and offline metrology data into the metrology data storage unit 320 for later retrieval (blocks 1040, 1080). The process tool control unit 530 also sends a status to the computer system 430 indicating that a particular set of integrated metrology data is available. Completion of the steps described in FIGS. 10A and 10B substantially completes the process of performing integrated and/or offline metrology data transfer and status update as indicated in blocks 840 and 850 of FIG. 8. The system 300 uses the stored integrated and offline metrology data to perform the dynamic time and constant time process controls as described above.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process control component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a process operation on a first semiconductor wafer within a first lot of semiconductor wafers using a processing tool;
    acquiring integrated metrology data from said first semiconductor wafer, said integrated metrology data comprising inline metrology data acquired using an integrated metrology tool being integrated within said processing tool;
    performing a dynamic time process control based upon said integrated metrology data, said dynamic time process control comprising a wafer-to-wafer feedback loop;
    processing a second semiconductor wafer within said first lot based upon said dynamic time process;
    acquiring offline metrology data from at least one of said first semiconductor wafer and said second semiconductor wafer from said first lot; and
    performing a constant time process control based upon said offline metrology data and said integrated metrology data, said constant time process control comprising performing a lot-to-lot feedback process for a second lot of semiconductor wafers.

2. The method of claim 1, further comprising performing an integrated metrology data transfer and status update in response to acquiring said integrated metrology data.

3. The method of claim 2, wherein performing said integrated metrology data transfer and status update further comprises:
    informing a computer system that controls an operation of a processing tool that integrated metrology data has been acquired;
    receiving a signal from said computer system to send said integrated metrology data; and
    transferring said integrated metrology data from said processing tool to said computer system for storage in response to receiving said signal.

4. The method of claim 1, further comprising performing an offline metrology data transfer and status update in response to acquiring said offline metrology data.

5. The method of claim 4, wherein performing said offline metrology data transfer and status update further comprises:
    informing a computer system that controls an operation of a processing tool that offline metrology data has been acquired;
    receiving a signal from said computer system to send said offline metrology data; and
    transferring said offline metrology data from said processing tool to said computer system for storage in response to receiving said signal.

6. The method of claim 1, wherein acquiring integrated metrology data further comprises:
    receiving a signal that at least one semiconductor wafer in said lot has been manufactured;
    targeting a particular semiconductor wafer for acquisition of integrated metrology data in response to said signal; and
    acquiring integrated metrology data from said targeted semiconductor wafer using an integrated metrology tool.

7. The method of claim 1, wherein acquiring offline metrology data further comprises:
    receiving a signal that a plurality of semiconductor wafers in said lot have been processed;
    targeting at least one of said plurality of processed semiconductor wafers for acquisition of offline metrology data in response to said signal; and
    acquiring offline metrology data from said targeted semiconductor wafer using an offline metrology tool.

8. The method of claim 1, wherein performing a dynamic time process control based upon said integrated metrology data further comprises:
    determining whether there is an error on said first semiconductor wafer in said lot based upon said integrated metrology data;
    calculating a correction factor to reduce the possibility of said error during a subsequent process performed on said second semiconductor wafer in response to said determination that there is an error on said first semiconductor wafer; and
    modifying dynamically at least one control input parameter used to perform a process on said second semiconductor wafer within said lot, based upon said correction factor.

9. The method of claim 1, wherein performing a constant time process control based upon said offline metrology data further comprises:
    determining whether there is an error on at least one semiconductor wafer in said lot based upon at least one of said offline metrology data and said integrated metrology data;

calculating a correction factor to reduce the possibility of said error during a subsequent processing of a subsequent lot of semiconductor wafers based upon said determination of error; and modifying at least one control input parameter used to perform a process on a subsequent semiconductor wafer within said subsequent lot based upon said correction factor.

10. A method, comprising:

performing a process operation on a plurality of semiconductor wafers in a manufacturing lot of semiconductor wafers using a processing tool;

acquiring integrated metrology data from at least one processed semiconductor wafer of said lot using an integrated metrology tool; said integrated metrology data comprising inline metrology data acquired using an integrated metrology tool being integrated within said processing tool;

acquiring offline metrology data from a plurality of processed semiconductor wafer of said lot using an offline metrology tool;

performing a wafer-to-wafer feedback process control based upon an error detected on at least one semiconductor wafer in said lot in a dynamic fashion; and performing a lot-to-lot feedback process control for processing a subsequent lot of semiconductor wafer at a predetermined constant time period based upon an analysis of a combination of said integrated metrology data and said offline metrology data.

11. The method of claim 10, wherein performing a wafer-to-wafer feedback process control based upon said integrated metrology data further comprises:

determining whether there is an error on a first semiconductor wafer in said lot based upon said integrated metrology data;

calculating a correction factor to reduce the possibility of said error during a subsequent process performed on a second semiconductor wafer in response to said determination that there is an error on said first semiconductor wafer; and modifying dynamically at least one control input parameter used to perform a process on said second semiconductor wafer within said lot, based upon said correction factor.

12. The method of claim 10, wherein performing a lot-to-lot feedback process control based upon said offline metrology data further comprises:

determining whether there is an error on at least one semiconductor wafer in said lot based upon at least one of said offline metrology data and said integrated metrology data;

calculating a correction factor to reduce the possibility of said error during a subsequent processing of a subsequent lot of semiconductor wafers based upon said determination of error; and modifying at least one control input parameter used to perform a process on a subsequent semiconductor wafer within said subsequent lot, based upon said correction factor.

* * * * *

UNITED STATES PATENT AND TRADEMARK OFFICE
CERTIFICATE OF CORRECTION

PATENT NO. : 6,645,780 B1
DATED : November 11, 2003
INVENTOR(S) : Thomas J. Sonderman and Alexander J. Pasadyn It is certified that error appears in the above-identified patent and that said Letters Patent is hereby corrected as shown below:

Column 7,
Line 3, replace "not shown)" with -- (not shown) --.

Column 10,
Line 58, replace "modem" with -- modern --.

Signed and Sealed this

Second Day of March, 2004

JON W. DUDAS
*Acting Director of the United States Patent and Trademark Office*